United States Patent
Li et al.

(10) Patent No.: US 9,941,897 B1
(45) Date of Patent: Apr. 10, 2018

(54) DIGITAL-TO-ANALOG CONVERTER WITH IMPROVED LINEARITY

(71) Applicant: Analog Devices Global, Hamilton (BM)

(72) Inventors: Hongxing Li, Andover, MA (US); Roberto Sergio Matteo Maurino, Turin (IT)

(73) Assignee: Analog Devices Global, Hamilton (BM)

(*) Notice: Subject to any disclaimer, the term of this patent is extended or adjusted under 35 U.S.C. 154(b) by 0 days.

(21) Appl. No.: 15/692,812

(22) Filed: Aug. 31, 2017

(51) Int. Cl.
   | | |
   |---|---|
   | H03M 1/66 | (2006.01) |
   | H03M 1/20 | (2006.01) |
   | H03M 1/06 | (2006.01) |
   | H03M 1/46 | (2006.01) |

(52) U.S. Cl.
   CPC ......... *H03M 1/201* (2013.01); *H03M 1/0639* (2013.01); *H03M 1/462* (2013.01); *H03M 1/66* (2013.01)

(58) Field of Classification Search
   CPC ........ H03M 3/502; H03M 3/464; H03M 3/50; H03M 1/0668; H03M 1/66; H03M 7/3026; H03M 1/066; H03M 1/0673; H03M 1/687; H03M 1/682; H03M 3/504; H03M 1/0641; H03M 3/30; H03M 3/506; H03M 7/165
   USPC .................................................. 341/143–145
   See application file for complete search history.

(56) References Cited

U.S. PATENT DOCUMENTS

| | | | | |
|---|---|---|---|---|
| 5,977,899 A * | 11/1999 | Adams | .................... | H03M 3/50 341/143 |
| 6,137,430 A * | 10/2000 | Lyden | .................... | H03M 1/069 341/144 |
| 6,348,884 B1 | 2/2002 | Steensgaard | | |
| 6,697,004 B1 * | 2/2004 | Galton | .................. | H03M 1/066 341/143 |
| 6,885,330 B2 * | 4/2005 | Trotter | .................. | H03M 3/506 341/145 |
| 9,735,799 B1 * | 8/2017 | Nguyen | .................. | H03M 1/66 |
| 2003/0112166 A1 * | 6/2003 | Al-Awadhi | ............. | H03M 3/50 341/143 |
| 2005/0225472 A1 * | 10/2005 | Schoner | ................ | H03M 3/368 341/166 |
| 2011/0018753 A1 * | 1/2011 | Lou | ...................... | H03M 7/3022 341/144 |
| 2015/0009058 A1 * | 1/2015 | Nentwig | ................. | H03M 3/50 341/144 |
| 2016/0308545 A1 * | 10/2016 | Chandra | ............... | H03M 1/066 |

* cited by examiner

*Primary Examiner* — Linh Nguyen
(74) *Attorney, Agent, or Firm* — Schwegman Lundberg & Woessner, P.A.

(57) ABSTRACT

A higher accuracy ADC circuit (e.g., in which the number of bits of the ADC circuit is twelve or greater) may need calibration multiple times during its working life to avoid bit weight errors. Described are techniques to address DAC element ratio errors between DAC element clusters in a DAC circuit in order to maintain the linear performance of analog-to-digital converter (ADC) circuits and digital-to-analog converter (DAC) circuits.

21 Claims, 12 Drawing Sheets

DIGITAL-TO-ANALOG CONVERTER WITH IMPROVED LINEARITY

FIELD OF THE DISCLOSURE

The present disclosure relates generally to the field of data converter circuits and systems and, more particularly, to digital-to-analog converters.

BACKGROUND

Electronic systems can include analog-to-digital (A/D) converters (ADCs). Converting analog signals to digital quantities allows processors in electronic systems to perform signal processing functions for the systems. Performance of ADC circuits can depend on environmental conditions such as temperature and on variations that can occur during manufacturing.

SUMMARY OF THE DISCLOSURE

This document describes techniques to maintain the linear performance of analog-to-digital converter (ADC) circuits and digital-to-analog converter (DAC) circuits. A higher accuracy ADC circuit (e.g., in which the number of bits of the ADC circuit is twelve or greater) may need calibration multiple times during its working life to avoid bit weight errors. The present inventors have recognized a need for improved calibration of ADCs.

In some aspects, this disclosure is directed to a digital-to-analog converter (DAC) circuit to reduce gain mismatch errors and including an input to receive a stream of digital input words, each digital input word partitioned into a most significant bit (MSB) digital subword and a least significant bit (LSB) digital subword. The circuit comprises a digital noise shaper circuit to receive a representation of the LSB subword, the digital noise shaper configured to output a modulated LSB subword; an LSB DAC circuit to receive and convert a combination of a representation of the LSB subword and the modulated LSB subword and to generate a first analog output; an MSB DAC circuit to receive and convert a combination of a representation of the MSB digital subword and the modulated LSB subword and to generate a second analog output, wherein each of the first analog output and the second analog output are combined to produce an analog output that represents the stream of digital input words.

In some aspects, this disclosure is directed to a method of operating a digital-to-analog converter circuit to reduce gain mismatch errors. The method comprises receiving a stream of digital input words, each digital input word partitioned a most significant bit (MSB) digital subword and a least significant bit (LSB) digital subword; noise shaping a representation of the LSB subword to generate a modulated LSB subword; receiving and converting a combination of a representation of the LSB subword and the modulated LSB subword and generating a first analog output; receiving and converting a combination of a representation of the MSB digital subword and the modulated LSB subword and generating a second analog output; and combining each of the first analog output and the second analog output to produce an analog output that represents the stream of digital input words.

In some aspects, this disclosure is directed to an integrated circuit device comprising an analog-to-digital converter circuit including a digital-to-analog converter (DAC) circuit. The DAC circuit comprises a segmentation circuit including an input to receive a stream of digital input words, each digital input word including a MSB digital subword and an LSB digital subword, the segmentation circuit comprising: a digital noise shaper circuit having an input to receive a representation of the LSB subword, the digital noise shaper configured to output a modulated LSB subword, wherein the modulated LSB subword has a smaller word length than the LSB subword; an LSB circuit to receive the LSB digital subword and the modulated LSB subword, the LSB circuit to subtract the modulated LSB subword from the corresponding LSB digital subword to generate a first digital output, the LSB circuit including an LSB encoder circuit; an MSB circuit to receive the MSB digital subword and the modulated LSB subword, the MSB circuit to add the modulated LSB subword and the MSB digital subword to generate a second digital output, the MSB circuit including an MSB encoder circuit. The DAC circuit comprises an LSB DAC circuit to receive and convert a representation of the first digital output and to generate a first analog output using an LSB DAC circuit output; an MSB DAC circuit to receive and convert a representation of the second digital output and to generate a second analog output using an MSB DAC circuit output, wherein the LSB DAC circuit and the MSB DAC circuit generate the first and second analog outputs, respectively, in proportion to the relative bit weights of the LSB and MSB digital subwords, wherein the LSB DAC circuit output is coupled to the MSB DAC circuit output to combine each of the first analog output and the second analog output to produce an analog output that represents the stream of digital input words.

This overview is intended to provide an overview of subject matter of the present patent application. It is not intended to provide an exclusive or exhaustive explanation of the invention. The detailed description is included to provide further information about the present patent application.

Figure 1:
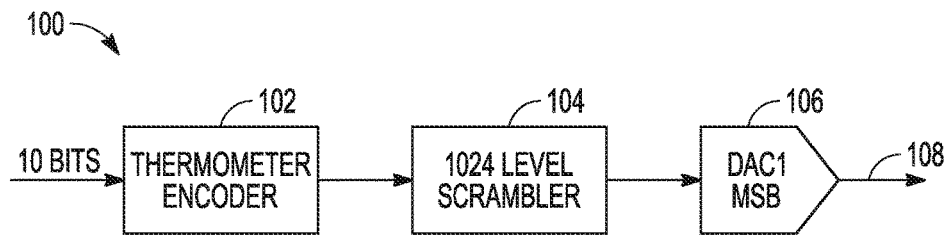
FIG. 1 is an example of a portion of digital-to-analog converter utilizing scrambling for frequency shaping of analog mismatch errors.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1 is an example of a portion of an existing digital-to-analog converter utilizing scrambling for frequency shaping of analog mismatch errors. The DAC circuit 100 of FIG. 1 can include a thermometer encoder circuit 102 to receive and encode an N-bit, e.g., 10-bit, input signal. The thermometer encoder circuit 102 can convert the N binary-weighted bits into M equally-weighted bits, where M equals $2^N$. The equally-weighted bits can be passed through a scrambler 104 and then applied to a digital-to-analog converter (DAC) 106 having equally-weighted analog elements that sum the outputs of the scrambler 104 to form an analog signal 108. The analog elements can be switched capacitors that deliver packets of charge, switched currents, or switched voltages that are summed with resistors. The DAC 106 can be followed by an analog low pass filter that can remove the out-of-band noise produced by a digital modulator (not depicted).

It can be desirable to use a large number of bits to increase the resolution. This can cause the required circuit area and power consumption to increase and is not practical in the converter system of FIG. 1. For example, the 10-bit DAC circuit 100 of FIG. 1 would require a 1024-level scrambler ($2^N$ where N=10).

The number of analog elements and swapper cells may be reduced by using two or more DACs instead of a single DAC with $2^N$ levels. Each DAC can include its own thermometer encoder, and the analog weights for each DAC can be different, as shown in the example of FIG. 2.

Figure 2:
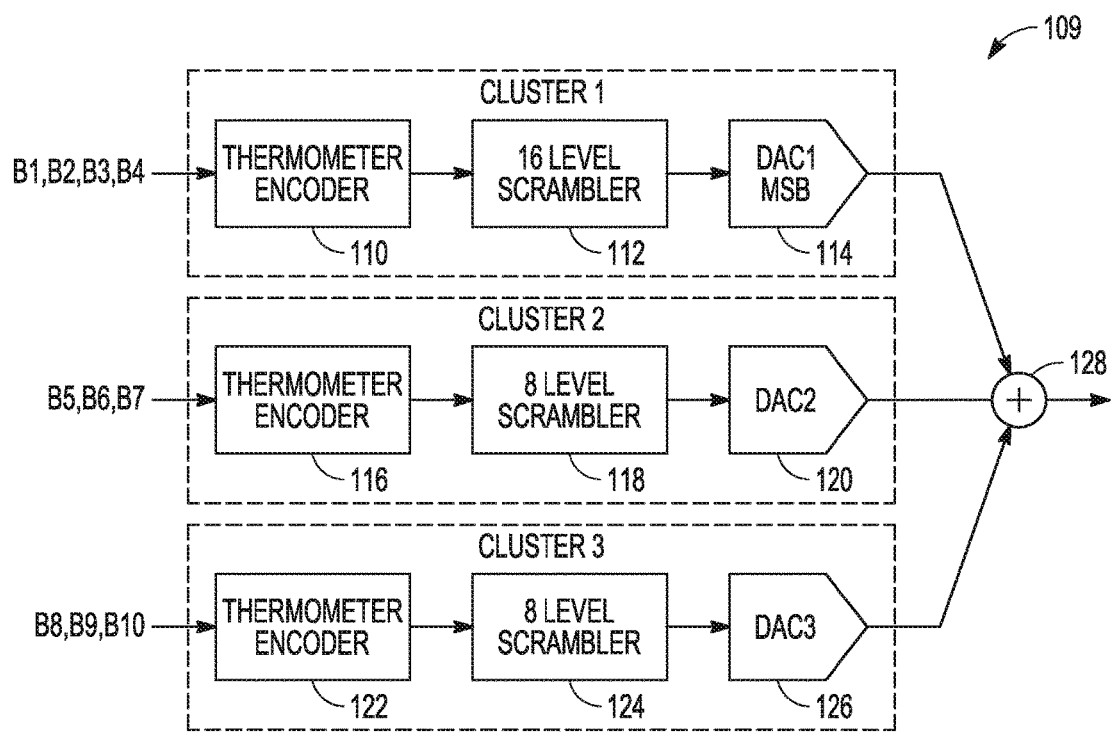
FIG. 2 is a block diagram of a digital-to-analog converter utilizing bit splitting techniques.

FIG. 2 is a block diagram of a digital-to-analog converter circuit utilizing bit splitting techniques. In the DAC circuit 109 of FIG. 2, an N-bit word can be split into the most significant bits (MSBs), least significant bits (LSBs), sub-LSBs, sub-sub-LSBs, etc. For example, in FIG. 2, a 10-bit word can be split into the four (4) MSBs B1-B4, three (3) LSBs B5-B7, and three sub-LSBs B8-B10.

The four MSBs B1-B4 can be converted by a thermometer encoder 110 into 15 equally-weighted bits, which pass through a scrambler 112 and drive a 16-level DAC 114. The three LSBs B5-B7 can be converted by a thermometer encoder 116 into 7 equally-weighted bits, which pass through a scrambler 118 and drive an 8-level DAC 120. The three sub-LSBs B8-B10 can be converted by a thermometer encoder 122 into 7 equally-weighted bits, which pass through a scrambler 124 and drive an 8-level DAC 126.

The analog outputs of DACs 114, 120, and 126 can be summed at 128. The output of DAC 114 has bit weights of K, while the output of DAC 120 has bit weights of K/16 and the output of DAC 126 has bit weights of K/128. The output at 128 is an analog value that equals the 10-bit digital input word. Only 32 analog elements are required (16+8+8), as compared with 1024 elements required in the converter of FIG. 1.

For purposes of this disclosure, each associated thermometer encoder, scrambler, and DAC can be referred to as a "cluster". FIG. 2 depicts three (3) clusters, where "cluster 1" is associated with the four MSBs B1-B4, "cluster 2" is associated with the three LSBs B5-B7, and "cluster 3" is associated with the three LSBs B8-B10.

As mentioned above, the techniques of FIG. 2 can advantageously reduce the number of analog elements and swapper cells by using multiple DACs instead of a single DAC with $2^N$ levels, thereby reducing hardware costs. In addition, each of the DACs 114, 120, 126 can be linearized because, on average, each element in DACs 114, 120, 126 has the same usage as a result of the scrambler. Any mismatches between elements of a DAC, e.g., resistor elements, capacitor elements, current source elements, can be overcome because the elements are used the same amount on average.

Although any errors in the DACs 114, 120, 126 are modulated into noise as a result of using the scramblers, errors that result from gain mismatches between the three DACs are not fixed and therefore produce tones. For example, if the average weight of the elements in DAC2 120 is different from the average weight of the elements in DAC1 114, there is gain mismatch between those two DACs.

The gain mismatch between DACs can cause nonlinearity error that depends on the input signal. If the DACs are perfect and there is no gain mismatch, when the outputs of the DACs are combined, there is no error. However, if there is gain mismatch, when the outputs of the DACs are combined, this mismatch error can cause significant of distortion and harmonics.

Figure 3:
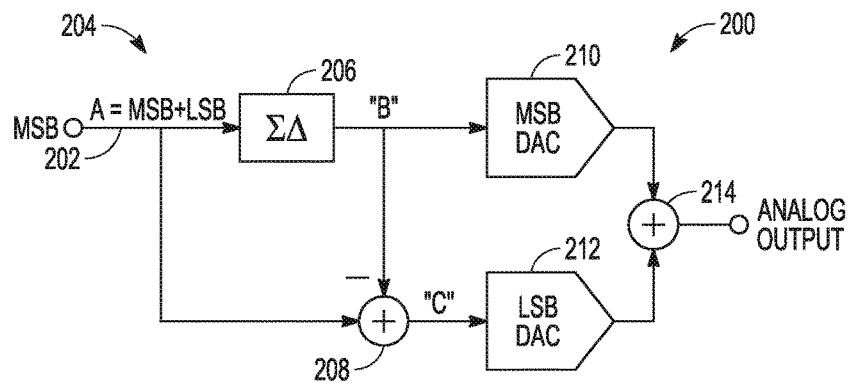
FIG. 3 is a conceptual diagram depicting an example of an existing DAC circuit to noise shape error that results from gain mismatch between multiple DACs in the DAC circuit.

FIG. 3 is a conceptual diagram depicting an example of an existing DAC circuit 200 to noise shape error that results from gain mismatch between multiple DACs in the DAC circuit. Described in more detail below, the delta-sigma modulator outputs the input signal plus shaped quantization noise. The LSB DAC is driven by the difference between the output of the delta-sigma modulator and the input signal, which equals the shaped quantization noise. The benefit of using the shaped quantization noise to drive the LSB DAC is that it is signal independent and does not show nonlinearity. It is also shaped so that at low frequencies, e.g., the frequencies of interest, there is very little noise content.

More specifically, a digital input word "A", including MSBs and LSBs, can be applied to an input 202 of a segmentation circuit 204, including a digital noise shaper circuit 206, e.g., a delta-sigma modulator, or a PWM modulator. The digital input words A are applied to the digital noise-shaper 206, which reduces the word length of the input words A and produces noise-shaped digital subwords B. The error introduced by the word length reduction is noise-shaped rather than white. A second digital subword C is produced by subtracting subword B from input word A in subtractor 208. The delta-sigma modulator 206 and subtractor 208 split, or segment, the digital input word A into subwords B and C.

The subword C equals A-B, and B+C=A. The digital subword B is MSB aligned with the digital input word A in the subtractor 208, with the two low order bits of the subword B input to subtractor 208 set to logic zero. Since the subword B tracks the input word A, the subword C is small and has fewer bits than the original input word A. Since input words A are noise-shaped, subwords B and C are noise-shaped. The subwords B and C are both noise-shaped and have smaller word lengths than input word A, and their sum equals the original input word A.

Subword B is received by MSB DAC 210 and subword C is received by LSB DAC 212. Subword B equals the A plus the noise transfer function (NTF) of the digital noise-shaper 206 (H) multiplied by its quantization error (E), so B=A+HE. Because C=A-B, C=A-(A+HE)=-HE. In this manner, the MSB DAC 210 of FIG. 3 receives the input A plus the quantization noise HE, and the LSB DAC 212 receives the negative quantization noise, or -HE. The MSB DAC output is coupled to the LSB DAC output to combine their analog outputs at 214 and produce an analog output that represents the stream of digital input words A.

Additional information regarding the circuit of FIG. 3 can be found in commonly assigned U.S. Pat. No. 5,977,899 to Robert W. Adams, the entire content of which being incorporated herein by reference.

The present inventors have recognized, however, that gain errors between the MSB DAC and the LSB DAC in FIG. 3 (or similarly, between DAC 1, DAC2, and DAC3 of FIG. 2) may not be fixed using the techniques of FIG. 2. Using various techniques, this disclosure addresses DAC element ratio errors between clusters, e.g., cluster 1, cluster 2, and cluster 3 of FIG. 2, of a DAC circuit.

Figure 4:
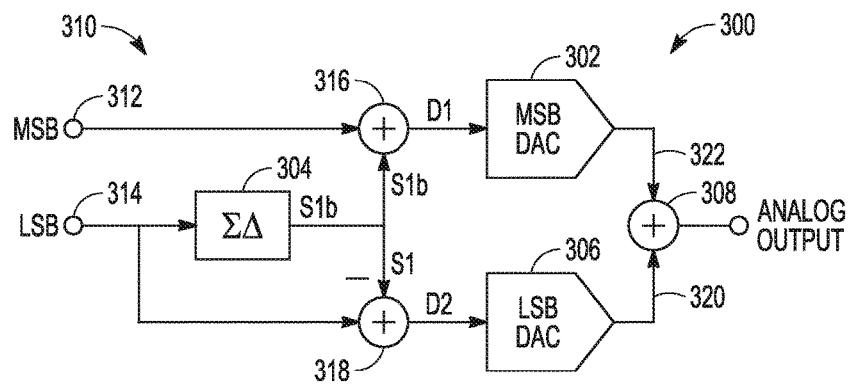
FIG. 4 is a conceptual diagram depicting an example of a DAC circuit to noise shape error that results from gain mismatch between multiple DACs in the DAC circuit, using various techniques of this disclosure.

FIG. 4 is a conceptual diagram depicting an example of a DAC circuit 300 to noise shape error that results from gain mismatch between multiple DACs in the DAC circuit, using various techniques of this disclosure. Described in more detail below, in FIG. 4 the MSB input is fed to the main or MSB DAC circuit 302. The LSBs are noise shaped by a noise-shaper circuit 304, e.g., delta-sigma modulated, which is then added to the MSB DAC circuit 302. As such, the MSB DAC circuit 302 is driven by D1, which includes the MSBs and the LSBs and where the LSBs include shaped noise. The LSB DAC circuit 306 is driven by D2, which is the difference between the output of the delta-sigma modulator (LSBs plus shaped noise) and the input to the delta-sigma modulator (LSB), which equals the negative shaped quantization noise. With proper modulation, signal D2 has no signal component. It has a small or even zero DC mean value.

If there is no gain mismatch between the elements in the MSB DAC circuit 302 and the elements in the LSB DAC circuit 306, then no error appears at the analog output 308 where the analog outputs of the MSB DAC circuit 302 and the LSB DAC circuit 306 are combined.

The DAC circuit 300 of FIG. 4 includes a segmentation circuit 310 including inputs 312, 314 to receive a stream of digital input words that include MSBs (MSB digital subwords) and LSBs (LSB digital subword). The segmentation circuit 310 further includes the digital noise-shaper 304, e.g., delta-sigma modulator, having an input to receive a representation of the LSB subword "LSB" and output a modulated LSB digital subword "S1b", where the modulated LSB digital subword has a smaller word length than the LSB subword, e.g., one bit. In FIG. 4, the modulated LSB subword output of the digital noise-shaper 304 can be, for example, a single bit "S1b" that includes both the LSB signal spectrum and any noise shaped quantization error.

The segmentation circuit 310 can include the MSB circuit 316 and an LSB circuit 318. As seen in FIG. 4, the LSB circuit 318 can receive the LSB digital subword ("LSB") and the modulated LSB subword ("S1b") and can subtract the modulated LSB subword ("S1b") from the corresponding LSB digital subword ("LSB") to generate a first digital output ("D2"), D2=LSB-S. The LSB circuit 318 can include an LSB encoder circuit, e.g., a thermometer encoder circuit 116, such as shown in FIG. 2. In some examples, the LSB circuit 318 can include a subtractor circuit coupled to thermometer encoder circuit, or the thermometer encoder circuit itself can perform the functionality of the subtractor circuit. In some examples, the LSB circuit 318 can include a scrambler, e.g., barrel shifter, such as shown at 112 in FIG. 2.

The MSB circuit 316 of FIG. 4 can receive the MSB digital subword ("MSB") and a representation, e.g., inverted version, of the modulated LSB subword ("S1") and can add the modulated LSB subword ("S1") to the corresponding MSB digital subword (MSB) to generate a second digital output (D1), D1=MSB+S. The MSB circuit 316 can include an MSB encoder circuit, e.g., a thermometer encoder circuit 110, such as shown in FIG. 2. In some examples, the MSB circuit 316 can include an adder circuit coupled to thermometer encoder circuit, or the thermometer encoder circuit can perform the functionality of the adder circuit. In some examples, the MSB circuit 316 can include a scrambler, e.g., barrel shifter, such as shown at 118 in FIG. 2.

The DAC circuit 300 of FIG. 4 can include the LSB DAC circuit 306 and the MSB DAC circuit 302. The LSB DAC circuit 306 can receive and convert a representation of the first digital output, LSB DAC code D2, and generate a first analog output 320 using an LSB DAC circuit output. The MSB DAC circuit 302 can receive and convert a representation of the second digital output, MSB DAC code D1, and generate a second analog output 322 using an MSB DAC circuit output. The combined code is D1+D2=(MSB+S1b)+(LSB+S1)=MSB+LSB.

The LSB DAC circuit 306 and the MSB DAC circuit 302 can generate the first and second analog outputs 320, 322, respectively, in proportion to the relative bit weights of the LSB and MSB digital subwords. The output of the LSB DAC circuit 306 can be coupled to the output of the MSB DAC circuit 302 to combine each of the first analog output and the second analog output to produce a DAC analog output at 308 that represents the stream of digital input words.

The DAC techniques shown in FIG. 4 and described in more detail below can be used with any type of analog to digital converter, including but not limited to SAR ADCs, pipeline ADCs, and delta-sigma ADCs.

Figure 5:
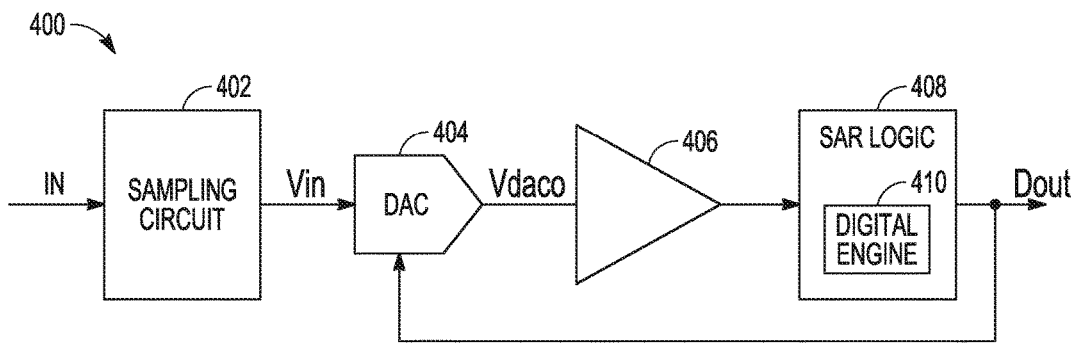
FIG. 5 is a functional block diagram of an example of an N-bit successive approximation register (SAR) ADC circuit that can implement various techniques of this disclosure.

FIG. 5 is a functional block diagram of an example of an N-bit successive approximation register (SAR) ADC circuit that can implement various techniques of this disclosure. The SAR ADC circuit 400 can include a sampling circuit 402, a digital-to-analog converter (DAC) circuit 404 (e.g., a capacitor DAC, a resistor DAC, a current source DAC), a comparator circuit 406, and SAR logic control circuitry 408.

The DAC circuit 404 can implement the DAC techniques described above with respect to FIG. 4, and as described throughout this disclosure. The DAC circuit 404 can include at least N weighted circuit components, such as in which the weight (e.g., capacitance value) of a particular weighted circuit component can be specified relative to that of one or more other weighted circuit components, with N being a positive integer. In certain examples, N is equal to sixteen and the weighted circuit components include sixteen capacitors (for example, with the sixteen capacitors including different multiples of a specified unit capacitor to obtain the weighting relative to each other). The sampling circuit 205 can sample an input voltage at an input to the ADC circuit and can hold a sampled voltage for comparison to another voltage using the weighted circuit components.

An output voltage of the DAC circuit 404 (Vdaco) can be compared to the sampled and held voltage, such as using a comparator circuit 406. The bit values of the DAC circuit 404 can be adjusted, such as based on the output of the comparator circuit 406. The conversion may start with the DAC set to midscale, in an example. The comparator 406 can determine whether the DAC output is greater or less than the sampled input voltage, and the comparison result can be stored as a one or zero for that bit of the DAC. Conversion then proceeds to the next bit value until all bits of the digital value are determined. One iteration of changing the DAC output and comparing the voltage to the input voltage can be referred to as a bit trial or a bit determination.

The SAR logic circuitry 408 can control the ADC operation, such as during the bit trials (charge balancing a reference charge stored on the bit trial capacitors against the sampled charge stored on the sampling capacitors). The SAR logic circuitry 408 initiates one sample of the input voltage, initiates the first conversion of the sampled input voltage to a first set of bit values, such as using a first set of bit trials, and initiates a second conversion of the sampled input voltage to a second set of bit values, such as using a second set of bit trials.

The logic circuitry can include a state machine or other digital engine 410 to perform functions such as progressing the ADC through different states of operation and to perform the calculations described. The logic circuitry 408 can determine the final N-bit digital value for the sampled input, and the final N-bit digital value can be made available at output Dout.

It should be noted that the although the techniques of this disclosure are described with respect to a SAR ADC, e.g., the SAR ADC 400 of FIG. 5, the techniques are not limited to SAR ADCs. Rather, the techniques can also be applied to delta-sigma ADCs, pipelined ADCs, pipelined SAR ADCs, as well as other ADCs.

Figure 6:
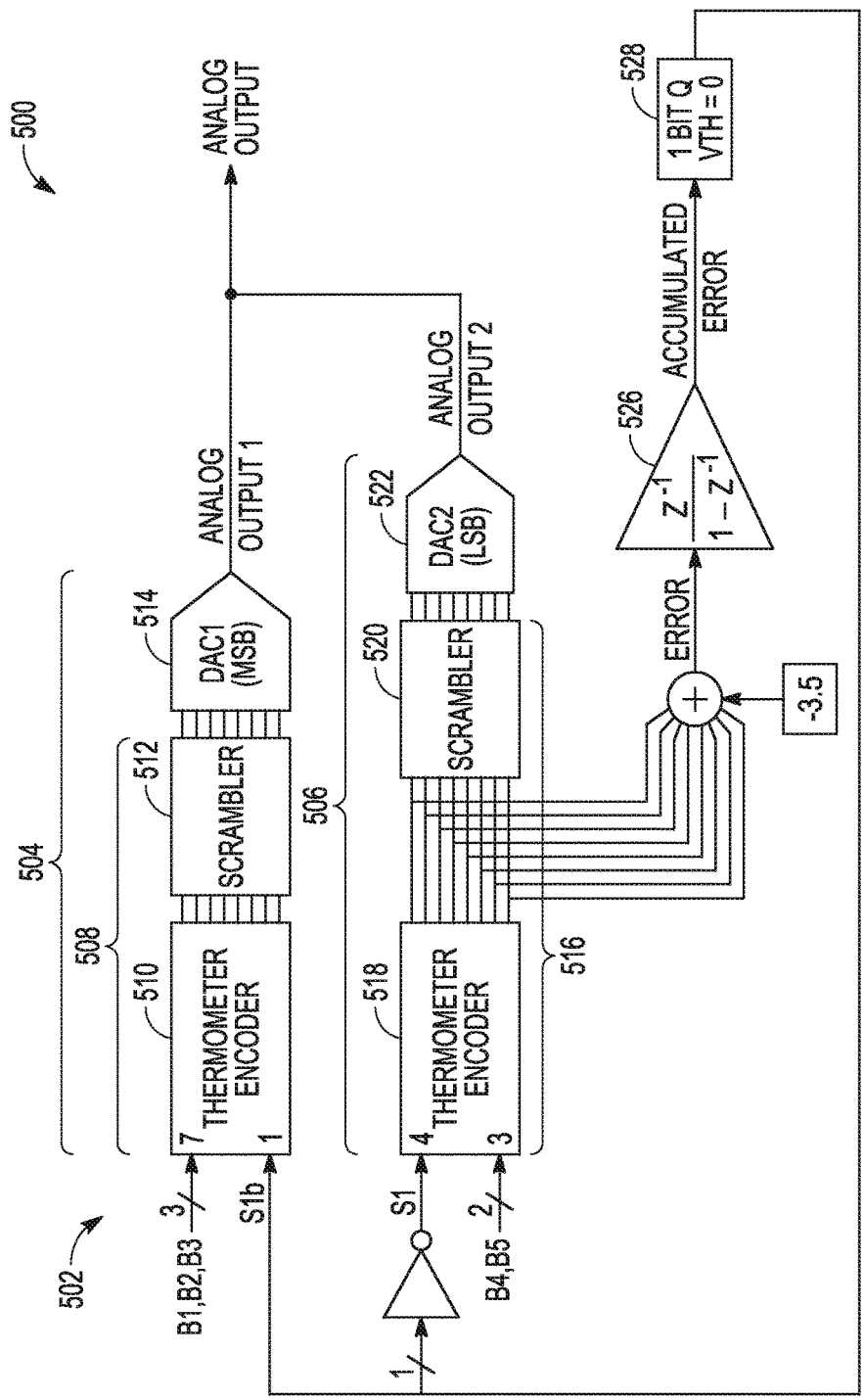
FIG. 6 is a block diagram of an example of DAC circuit to implement various techniques of this disclosure.

FIG. 6 is a block diagram of an example of DAC circuit 500 to implement various techniques of this disclosure. The DAC circuit 500 can implement the techniques described above with respect to FIG. 4. The DAC circuit 500 of FIG. 6 includes a segmentation circuit 502 that includes two clusters, 504 and 506. The cluster 504 can include an MSB circuit 508 including a thermometer encoder circuit 510 and scrambler circuit 512, and MSB DAC circuit 514, e.g., capacitor DAC, resistor DAC, current source DAC. The three MSBs B1-B3 and modulation bit "s1$b$" can be converted by the thermometer encoder 510 into 8 equally-weighted codes, which pass through the scrambler 512 and drive the 8-level MSB DAC 514. Each of the 8 lines shown control a single DAC element, e.g., capacitor, resistor, current source, in the MSB DAC circuit 514. The bits B1, B2, B3 control 7 elements and the modulation bit "s1$b$" controls one element.

The cluster 506 can include an LSB circuit 516 including a thermometer encoder circuit 518, scrambler circuit 520, and an LSB DAC circuit 522, e.g., capacitor DAC. The two LSBs B4-B5 and modulation bit "s1" can be converted by the thermometer encoder circuit 518 into 4 equally-weighted bits, which pass through the scrambler circuit 520 and drive the 4-level LSB DAC circuit 522. Each of the 7 lines shown control a single DAC element, e.g., capacitor, resistor, current source, in the LSB DAC circuit 522. The bits B4, B5 control 3 elements and the modulation bit "s1" controls 4 elements. Any error contributed by the LSB DAC circuit 522 is dependent upon codes B4, B5, as mentioned above (when B4, B5 are active). Modulation bits "s1" and "s1$b$" can also be referred to as "selection signals".

Before going into further details of FIG. 6, an intuitive description may be helpful. Bit "s1" can be modulated to cancel the signal component of B4, B5. This can be accomplished by monitoring the output of the LSB DAC circuit and modulating "s1" such that the sum of the LSB DAC circuit output is constant over a time average. The goal is for the LSB DAC circuit output to be close to an average value regardless of the values of B4, B5. Because there are 7 elements in the example cluster 2 (s1=4, and B4 B5=3), the average value is 3.5. For more or fewer elements, the average value would change accordingly. It should be noted that a different value to which an error can be compared can be calculated using other techniques, and this disclosure is not limited to using a value equal to half the number of elements.

It should also be noted that in the example shown in FIG. 6, "s1" controls 4 elements in the LSB DAC circuit and "s1$b$" controls 1 element in the MSB DAC circuit because the elements in the MSB DAC circuit are weighted 4 times greater than the elements in the LSB DAC circuit.

Any difference between the average value, e.g., 3.5, for example, and the actual LSB DAC output can be considered instant error for that particular sample and can be accumulated in a digital accumulator, e.g., an integrator. The accumulated error can be multiple bits, so it can be truncated by a quantizer and then added to B4, B5 as an input to the thermometer encoder. This quantity can be considered the input signal. The modulation bit "s1" is then matched to the signal as much as possible to correct the errors. By doing this, the accumulated error is bounded over time and the averaged error (accumulated error divided by number of samples) can be driven to zero.

The segmentation circuit 502 can include a digital noise shaper circuit 524. As seen in FIG. 6, the digital noise shaper circuit 524 can be coupled to the outputs of the thermometer encoder circuit 518 to receive a representation of the LSB subword B4, B5. In some examples, the digital noise shaper circuit 524 can include a delta-sigma modulator, as shown in FIG. 6, which includes an integrator circuit 526, e.g., a delaying integrator circuit, and a quantizer circuit 528. The digital noise shaper circuit 524 can output a modulated LSB subword "s1$b$", as seen in FIG. 6. As mentioned above, the modulated LSB subword "s1$b$" is the LSBs plus shaped noise. When summed, the LSBs B4, B5 plus "s1" equals the shaped quantization noise. It should be noted that "s1" and "s1$b$" are always complementary.

The MSB circuit 508 can receive the modulated LSB subword "s1$b$", and the LSB circuit 516 can receive a negated version of the modulated LSB subword "s1$b$" (e.g., via an inverter 530), namely "s1". The MSB DAC circuit 508 receives the MSBs and the LSBs, where the LSBs include shaped noise.

In the example shown in FIG. 6, the digital noise shaper circuit 524 can be coupled to the outputs of the thermometer encoder circuit 518 of cluster 506, or "cluster 2". In the specific non-limiting example shown in FIG. 6, cluster 2 includes 7 equal sized DAC elements. Because cluster 2 includes 7 equal sized DAC elements, it is desirable that the output sum of the thermometer encoder circuit 518 of cluster 2 is 3.5.

The actual output sum of the thermometer encoder circuit 518 minus 3.5 is considered to be instant error, or "error" as shown in FIG. 6. The digital noise shaper circuit 524, e.g., delta-sigma modulator, can accumulate and update the instant error each clock cycle using the integrator circuit 526. The quantizer circuit 528, e.g., a 1-bit quantizer, determines the quantized version of the accumulated error, e.g., "s1$b$" or "s1", in the next clock cycle. The delta-sigma modulator loop can make the accumulated error bound to a finite value, thus the average error is 0, where the average error equals the accumulated error divided by the accumulated time. The quantizer circuit 528 can output the modulated LSB subword "s1$b$", which can be fed to an input of the MSB circuit 508 and the LSB circuit 516 can receive a negated version of the modulated LSB subword "s1$b$", namely "s1".

Using the techniques of FIG. 6, the outputs of each of the thermometer encoder circuits 510, 518 can control the average element weight in their respective cluster because of the scrambler circuit in each cluster. Further, the modulation of cluster 2 by signal "s1" results in signal independent thermometer codes in cluster 2. For example, this can be achieved if half of the CDAC 2 elements in cluster 2 are "1" and half are "0" in time average for any given LSB code, e.g., B4, B5 in the specific example shown in FIG. 6.

To achieve the signal independent thermometer codes in cluster 2, redundant bits "s1$b$" and "s1" can be fed into cluster 1 and cluster 2, respectively.

Bit "s1$b$" can control one (1) DAC element in the MSB DAC circuit 514 in cluster 504 or "cluster 1", and bit "s1" can control four (4) DAC elements in the LSB DAC circuit 522 in cluster 2. Because in this particular example implementation the weight of a DAC element in the MSB DAC circuit 514 is four times the weight of a DAC element in the LSB DAC circuit 522, the total elements' weight controlled by "s1$b$" and "s1" are the same. Further, bits "s1$b$" and "s1" are complementary, so changing s1 only generates mismatch error at the combined DAC output.

The LSB circuit 516 can receive the LSB digital subword B4, B5 and the negated modulated LSB subword "s1" and generate a first digital output (D2=LSB−s1). The MSB circuit can receive the MSB digital subword B1, B2, B3 and the modulated LSB subword "s1$b$" and generate a second digital output (D1=MSB+s1).

The LSB DAC circuit 522 can receive and convert a representation of the first digital output and generate an analog output "Analog Output 2" using an LSB DAC circuit output. In some examples, the representation of the first digital output can include the result of the output of the thermometer encoder circuit 518 added with −3.5 in FIG. 6. The MSB DAC circuit 514 can receive and convert a representation of the second digital output and generate an analog output "Analog Output 1" using an MSB DAC circuit output. The LSB DAC circuit 522 and the MSB DAC circuit 514 can generate their analog outputs in proportion to the relative bit weights of the LSB and MSB digital subwords. As seen in FIG. 6, the LSB DAC circuit output is coupled to the MSB DAC circuit output to combine "Analog Output 1" and "Analog Output 2" to produce a combined analog output ("Analog Output") that represents the stream of digital input words.

Figure 7:
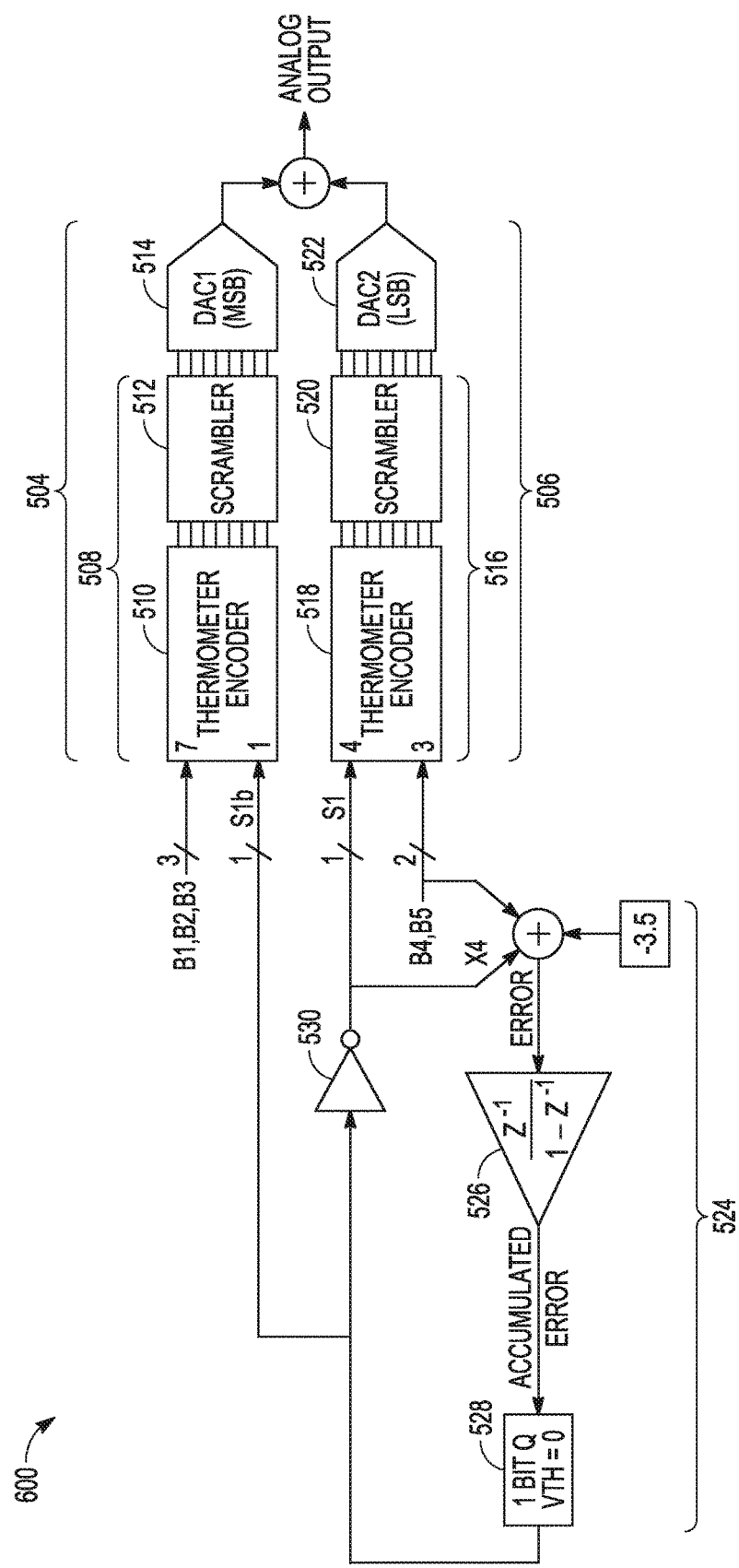
FIG. 7 is a block diagram of another example of DAC circuit to implement various techniques of this disclosure.

FIG. 7 is a block diagram of another example of DAC circuit to implement various techniques of this disclosure. The DAC circuit 600 can implement the techniques described above with respect to FIG. 4. The DAC circuit 600 includes some features similar to those described above with respect to FIG. 6 and, for purposes of conciseness, those features will not be described in detail again.

In contrast to the example shown in FIG. 6, the DAC circuit 600 of FIG. 7 couples the digital noise shaper circuit 524, e.g., delta-sigma modulator, to the input of the LSB circuit 516, e.g., the input of the thermometer encoder circuit 518, of cluster 2. The sum of the negated modulated LSB subword "s1" and LSB subword B4, B5 minus 3.5 is considered to be instant error, or "error" as shown in FIG. 7. As before, the digital noise shaper circuit 524, e.g., delta-sigma modulator, can accumulate and update the instant error each clock cycle using the integrator circuit 526, e.g., a delaying integrator circuit. The quantizer circuit 528, e.g., a 1-bit quantizer, determines the quantized version of the accumulated error, e.g., "s1$b$" or "s1", in the next clock cycle. The quantizer circuit 528 can output the modulated LSB subword "s1$b$", which can be fed to an input of the MSB circuit 508 and the LSB circuit 516 can receive a negated version of the modulated LSB subword "s1$b$", namely "s1".

In the example shown in FIG. 7, it should be noted that the modulation bits (or modulated LSB subwords or "selection codes") "s1" and "s1$b$" are based on previous B4, B5 values, not the present B4, B5 values. Essentially, the circuit of FIG. 7 predicts the value of "s1$b$" for the next sample B4, B5. However, this prediction may be inaccurate, which can result in distortion at the output. The present inventors have overcome this issue using the techniques of FIGS. 8 and 9. It should be noted that there is some delay in FIG. 7, resulting from the delaying integrator 526 in the delta-sigma modulator 524.

Figure 8:
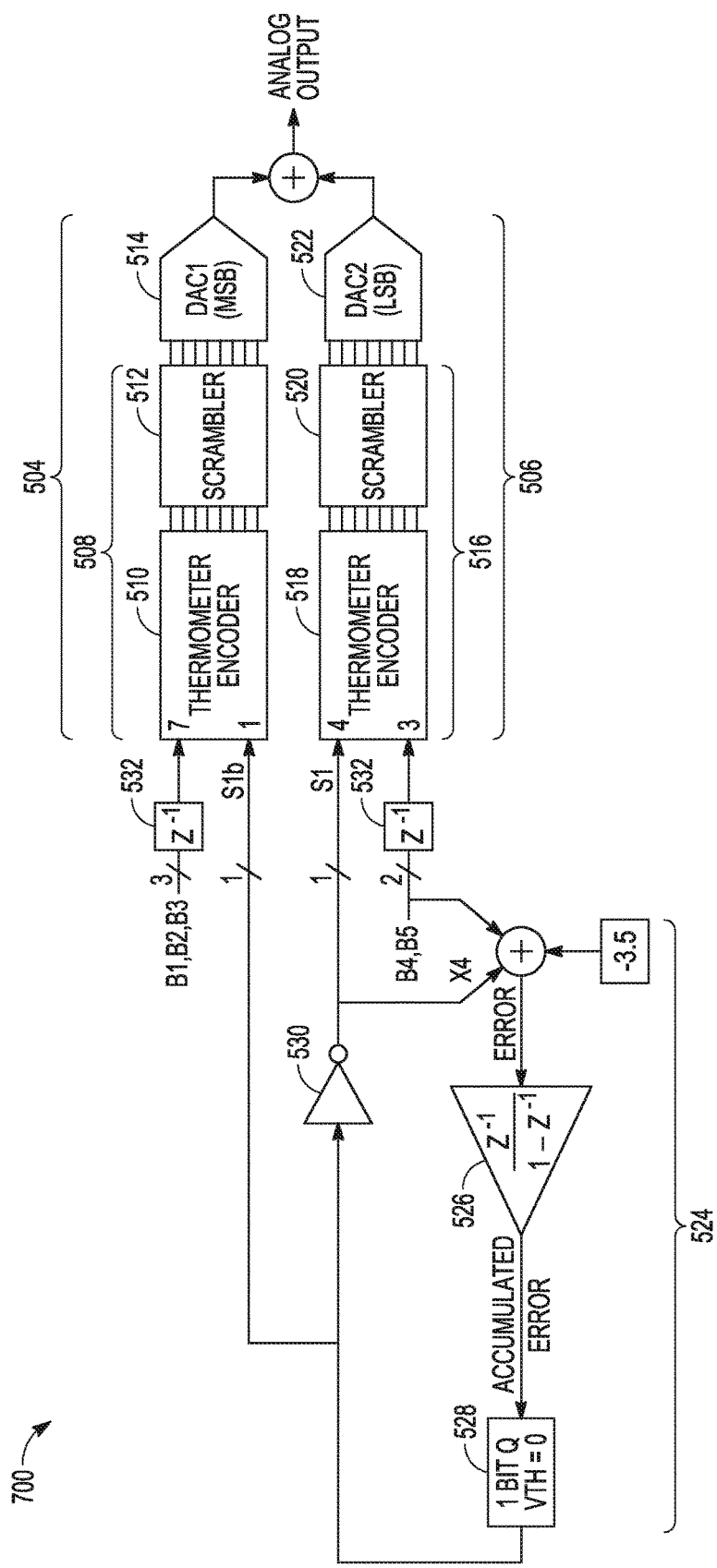
FIG. 8 is a block diagram of another example of DAC circuit to implement various techniques of this disclosure.

FIG. 8 is a block diagram of another example of DAC circuit to implement various techniques of this disclosure. The DAC circuit 700 can implement the techniques described above with respect to FIG. 4. The DAC circuit 700 includes some features similar to those described above with respect to FIGS. 6 and 7 and, for purposes of conciseness, those features will not be described in detail again.

As mentioned above regarding the DAC circuit 600 of FIG. 7, the modulation bits "s1" and "s1$b$" are calculated using previous B4, B5 values and not the present B4, B5 values. The DAC circuit 700 of FIG. 8 includes delay circuits 532 at the inputs of the MSB circuit 508 and the inputs of the LSB circuit 516, which can delay the samples by one clock cycle. Thus, the sample B4, B5 aligns with the "s1" signal and the sample B1, B2, B3 aligns with the "s1$b$" signal.

These delay circuits 532 introduce latency, however. Desirably, the modulation bits "s1" and "s1$b$" are predetermined before the present values of B1-B5 are updated, and thus there is no latency in the design. However, in some examples, the delta-sigma modulator 524 can generate undesirable tones when using an active B4, B5 signal. The present inventors have overcome the issue of tones in FIG. 8 using the techniques of FIG. 9.

Figure 9:
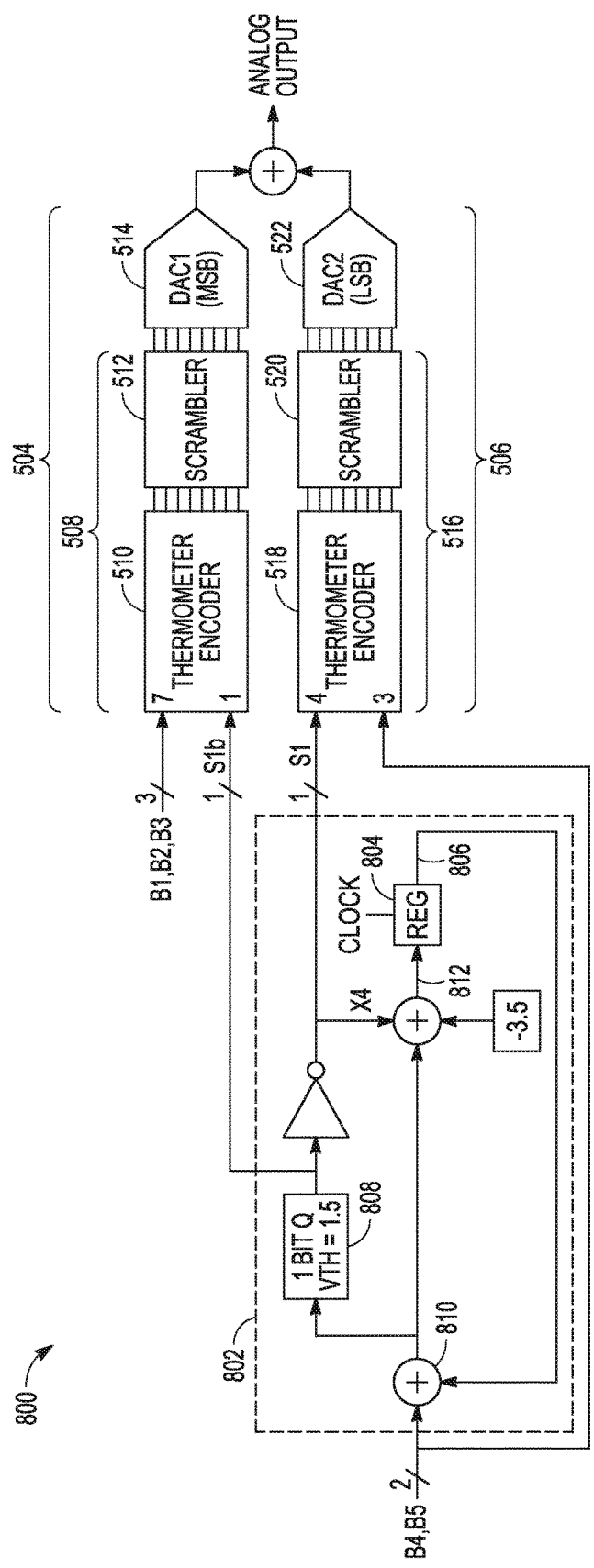
FIG. 9 is a block diagram of another example of DAC circuit to implement various techniques of this disclosure.

FIG. 9 is a block diagram of another example of DAC circuit to implement various techniques of this disclosure. The DAC circuit 800 can implement the techniques described above with respect to FIG. 4. The DAC circuit 800 includes some features similar to those described above with respect to FIGS. 6-8 and, for purposes of conciseness, those features will not be described in detail again. The circuit of FIG. 9 can eliminate the delays of FIGS. 7 and 8, and can eliminate undesirable tones.

The delta-sigma modulator 802 of FIG. 9 includes an error feedback configuration in which the input of the modulator 802 is summed with an output of the register 804. The delta-sigma modulator 802 is coupled to an input of the LSB circuit 516, and the modulated LSB subword "s1" received by the LSB circuit 516 is a complement of the modulated LSB subword "s1$b$" received by the MSB circuit 508.

The delta-sigma modulator 802 of FIG. 9 can calculate the modulation bits "s1" and "s1$b$" based on present B4, B5 information. Thus, the sample B4, B5 aligns with the "s1" signal and the sample B1, B2, B3 aligns with the "s1$b$" signal. In addition, the delta-sigma modulator 802 can suppress unwanted tones.

The delta-sigma modulator 802 can receive and sum the present B4, B5 value with a feedback signal 806 representing the previous error, which was stored in the register 804. The sum of the present B4, B5 value and the feedback signal 806 can be fed to the quantizer 808 to generate the modulation bits "s1" and "s1$b$". In addition, as seen in FIG. 9 at the adder 810, the sum of the present B4, B5 value and the feedback signal 806 can be added to the "s1" value, minus 3.5 (the average of the 7 bits in the example shown in FIG. 9 to produce the instant error at 812.

Figure 10A:
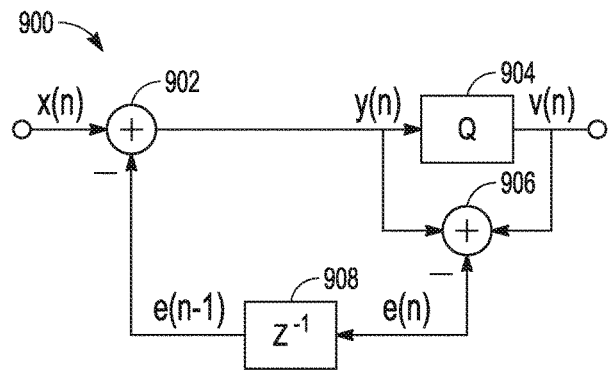
FIG. 10A is a conceptual diagram depicting a standard error feedback first order delta-sigma modulator.

FIG. 10A is a conceptual diagram depicting a standard error feedback first order delta-sigma modulator. The delta-sigma modulator 802 of FIG. 9 is different from but equivalent to the standard error feedback first order delta-sigma modulator 900 of FIG. 10A. The delta-sigma modulator 900 of FIG. 10A receives input signal x(n) and subtracts feedback error signal e(n−1) at subtractor 902 to produce signal y(n). Signal y(n) is fed into a quantizer 904 to produce output signal v(n). In addition, the signal y(n) is subtracted from the output signal v(n) at subtractor 906 to produce the current error signal e(n), which is fed to a delay circuit 908. The output signal v(n)=x(n)+e(n)−e(n−1), where v(n) is the modulation bit "s1$b$".

Figure 10B:
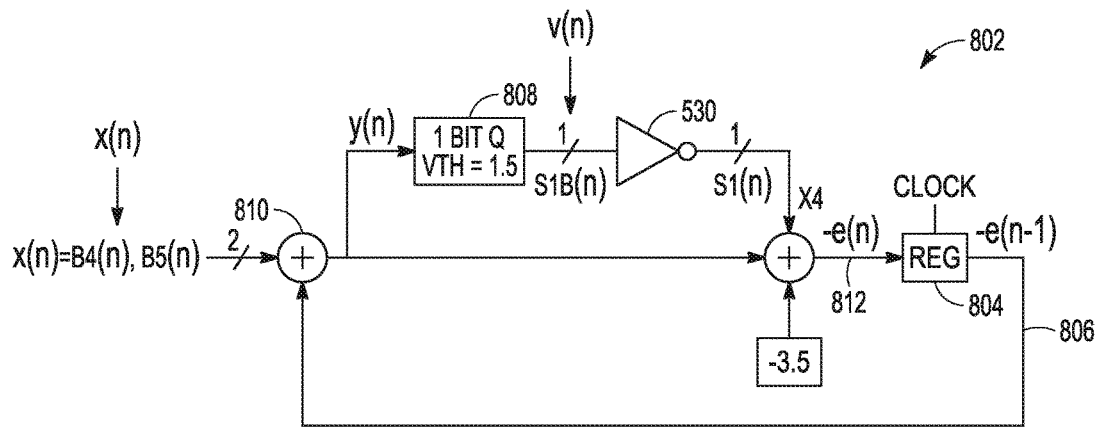
FIG. 10B depicts the example of the delta-sigma modulator of FIG. 9 including the nomenclature presented in FIG. 10A.

FIG. 10B depicts the example of the delta-sigma modulator 802 of FIG. 9 including the nomenclature presented in FIG. 10A. The nomenclature of the standard error feedback first order delta-sigma modulator 900 in FIG. 10A is mapped to the modulator in FIG. 10B to show their equivalency.

As seen in FIG. 10B, the input to the delta-sigma modulator 802 is signal x(n)=B4($n$), B5($n$). The modulation bit s1=−v(n)=−x(n)−[e(n)−e(n−1)]. The LSB DAC circuit 516 of FIG. 9 receives LSBs B4($n$), B5($n$) and s1($n$), so DAC2 data=x(n)+s1($n$)=−[e(n)−e(n−1)].

Referring to the Z domain, Z(s1$b$)=X(Z)+(1−Z$^{-1}$)E(Z). For the LSB cluster 506 of FIG. 9, or "cluster 2", Z(DAC2 data)=−(1−Z$^{-1}$)E(Z). For the MSB cluster 504 of FIG. 9, or "cluster 1", Z(DAC1 data)=Z(signal)+(1−Z$^{-1}$)E(Z), where (1−Z$^{-1}$)E(Z) is the noise-shaped component. So, the LSB cluster 506 of FIG. 9 receives noise and the MSB cluster 504 of FIG. 9 receives the signal plus a noise-shaped component. When combined at the outputs of the LSB DAC circuit 522 and the MSB DAC circuit 514, both of FIG. 9, Z(DAC 1 data)+Z(DAC2 data)=Z(signal)+(1−Z$^{-1}$)E(Z)−(1−Z$^{-1}$)E(Z) =Z(signal).

Figure 11:
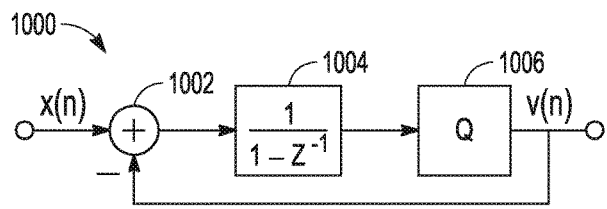
FIGS. 11 and 12 are conceptual diagrams depicting other examples of delta-sigma modulators that could be used to implement various techniques of this disclosure.
Figure 12:
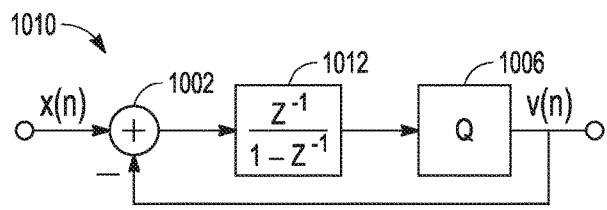

FIGS. 11 and 12 are conceptual diagrams depicting other examples of delta-sigma modulators that could be used to implement various techniques of this disclosure. The delta-sigma modulator 1000 of FIG. 11 is a first order delta-sigma modulator. The delta-sigma modulator 1000 receives input signal x(n) and subtracts output signal v(n) at subtractor 1002. The output of the subtractor 1002 is fed into a non-delaying integrator 1004. The output of the integrator 1004 is fed into a quantizer 1006 to produce output signal v(n). The output signal v(n)=x(n)+e(n)−e(n−1), where v(n) is the modulation bit "s1$b$". The non-delaying integrator of FIG. 11 can result in identical signal and quantization noise transfer functions to that of the delta-sigma modulator 900 of FIG. 10A. In some example implementations, however, it may not be practical to implement a non-delaying integrator.

The delta-sigma modulator 1010 of FIG. 12 is another first order delta-sigma modulator and is similar to the delta-sigma modulator 1000 of FIG. 11, where similar features are not described again for purposes of conciseness. In contrast to FIG. 11, delta-sigma modulator 1010 of FIG. 12 includes a delaying integrator 1012. The output signal v(n)=x(n−1)+e(n)−e(n−1), where v(n) is the modulation bit "s1$b$".

A delaying integrator can be more practical. A delaying integrator can still provide first order shaped quantization noise, but now the input x(n) is delayed by one sample and appears at the output as x(n−1).

Figure 13:
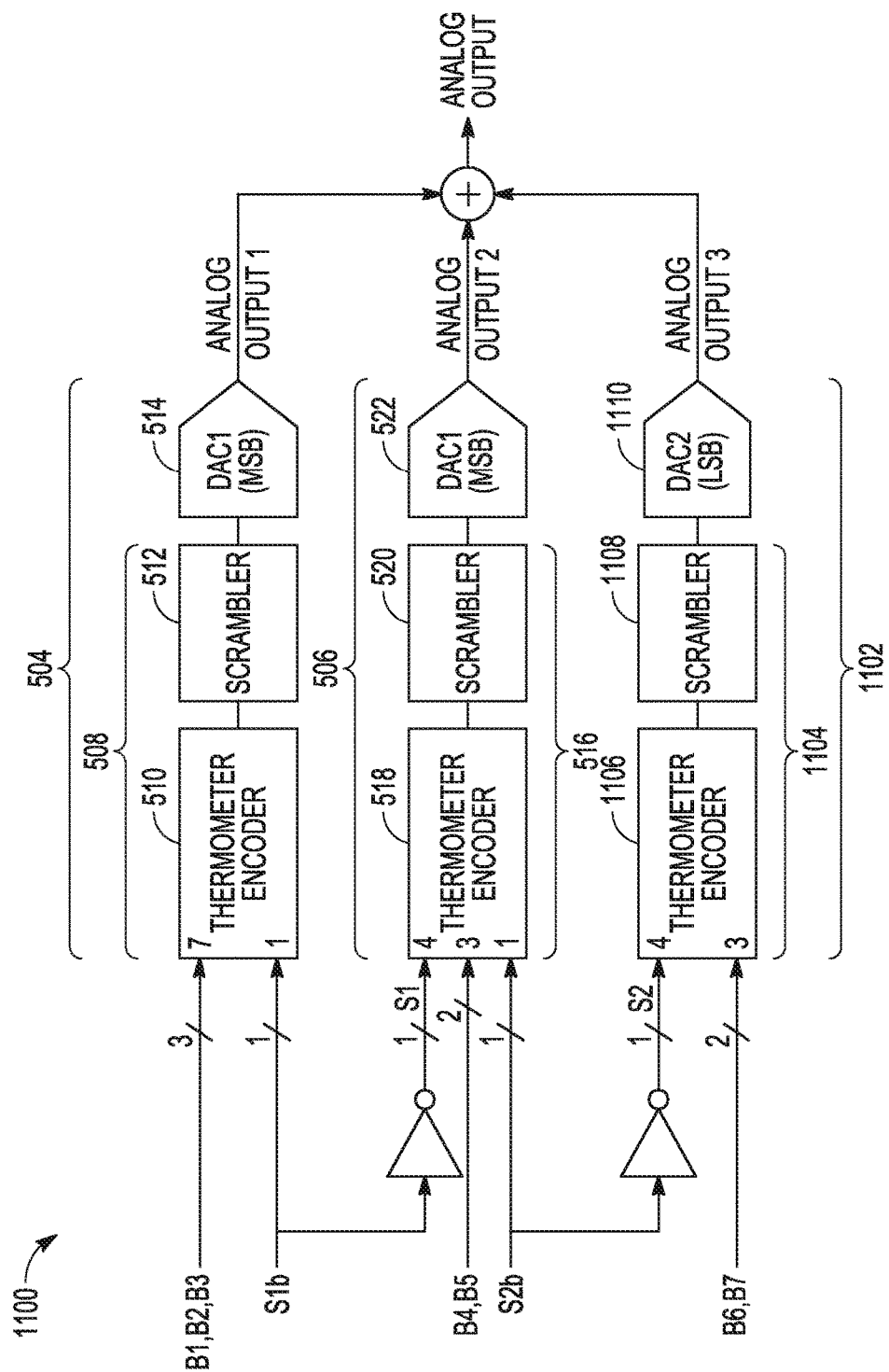
FIG. 13 is a block diagram of another example of DAC circuit to implement various techniques of this disclosure.

FIG. 13 is a block diagram of another example of DAC circuit to implement various techniques of this disclosure. FIG. 13 is similar to the DAC circuit of FIG. 6, but FIG. 13 depicts three (3) clusters (MSB cluster 504, LSB cluster 506, sub-LSB cluster 1102) instead of the two (2) clusters (MSB cluster 504, LSB cluster 506) of FIG. 6. For purposes of conciseness, similar features will not be described in detail again. It should be noted that the techniques of this disclosure are not limited to DAC circuits that include 2 or 3 clusters, but can be extended to more than 3 clusters.

The cluster 1102 can include a sub-LSB circuit 1104 including a thermometer encoder circuit 1106, and a scrambler circuit 1108, and a sub-LSB DAC circuit 1110, e.g., capacitor DAC, resistor DAC, current source DAC. The two sub-LSBs B6-B7 and modulation bit "s2" can be converted by the thermometer encoder circuit 1106 into 4 equally-weighted bits, which pass through the scrambler circuit 1108 and drive 4 DAC elements of the 8-level sub-LSB DAC circuit 1110. Each line shown between an encoder and a scrambler and between a scrambler and a DAC represents multiple lines where each one of the multiple lines can control a single DAC element, e.g., capacitor, resistor, current source, in the sub-LSB DAC circuit 1110. The bits B6, B7 control 3 elements and the modulation bit "s2" controls 4 elements. Any error contributed by the sub-LSB DAC circuit 522 is dependent upon codes B6, B7, as mentioned above (when B6, B7 are active). Modulation bits "s2" and "s2$b$" can also be referred to as "selection signals" or modulated sub-LSB subwords.

As seen in FIG. 13, MSB cluster 1 and LSB cluster 2 are controlled using modulation bits "s1$b$" and "s1", respectively, as described above. To correct any gain errors that may occur between LSB cluster 2 and sub-LSB cluster 3, modulation bits "s2$b$" and "s2" are included, where "s2$b$" is an input to LSB cluster 2 and "s2" is an input to sub-LSB cluster 3. It should be noted that "s2" and "s2$b$" are always complementary. The implementation of the s1/s2 control is shown and described in FIG. 14.

Figure 14:
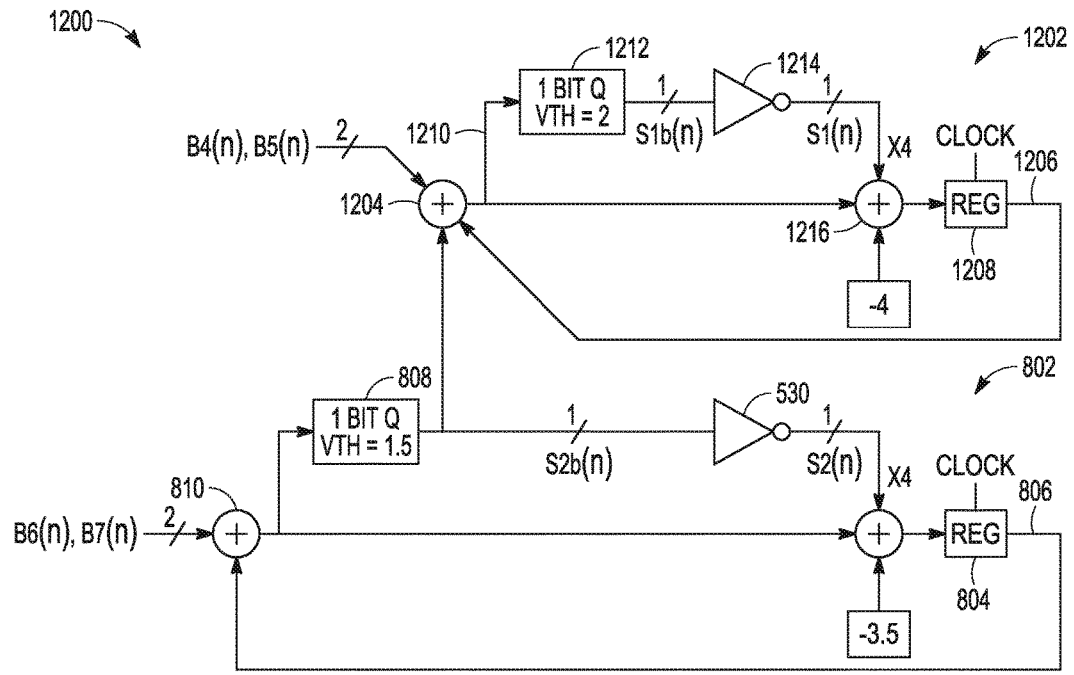
FIG. 14 depicts an example of a delta-sigma modulator circuit to control the three clusters in FIG. 13.

FIG. 14 depicts an example of a delta-sigma modulator circuit 1200 to control the three clusters in FIG. 13. The delta-sigma modulator circuit 1200 includes two delta-sigma modulator circuits 802, 1202. The delta-sigma modulator 802 shown in the bottom portion of FIG. 14 is similar to the delta-sigma modulator 802 of FIGS. 9 and 10B and will not be described in detail again. As seen in FIG. 14, the input to the delta-sigma modulator 1202 in the top portion is signal B6(*n*), B7(*n*) and the input to the delta-sigma modulator 802 is signal B4(*n*), B5(*n*).

The adder 1204 of the delta-sigma modulator 1202 receives signal B4(*n*), B5(*n*) and sums the modulation bit "s2*b*(*n*)" from the delta-sigma modulator 802 and the previous error 1206 that was stored in the register 1208. The result 1210 is fed into the quantizer 1212, e.g., a 1-bit quantizer, which outputs the modulation bit "s1*b*(*n*)". The modulation bit "s1*b*(*n*)" is inverted by inverter 1214 to produce the modulation bit "s1(*n*)", and the modulation bits "s1*b*(*n*)" and "s1(*n*)" are fed into cluster 1 and cluster 2, respectively, as seen in FIG. 13. Similarly, the modulation bit "s2*b*(*n*)" is inverted by inverter 530 to produce the modulation bit "s2(*n*)", and the modulation bits "s2*b*(*n*)" and "s2(*n*)" are fed into cluster 2 and cluster 3, respectively, as seen in FIG. 13.

In the delta-sigma modulator 1202, the output of the adder 1204 is fed the adder 1216 and summed with modulation bit "s1(*n*)" and −4, where −4 represents the average of the 8 elements of cluster 2 (4 elements for "s1", 3 elements for B4, B5, and 1 element "s2"). The output of the adder 1216 represents the instant error, which is stored in the register 1208.

Figure 15:
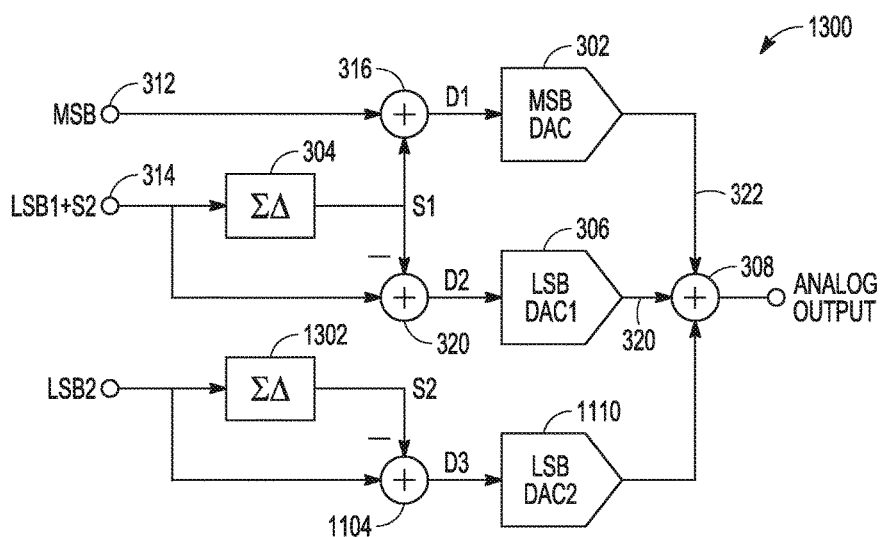
FIG. 15 is a conceptual diagram depicting an example of a DAC circuit to noise shape error that results from gain mismatch between the three DACs in FIG. 13.

FIG. 15 is a conceptual diagram depicting an example of a DAC circuit to noise shape error that results from gain mismatch between the three DACs in FIG. 13. The circuit 1300 of FIG. 15 extends the conceptual diagram of FIG. 4 from two (2) to three (3) clusters. Similar features will not be described again.

As seen in FIG. 15, the delta-sigma modulator 1302 of cluster 3 can generate the second modulation bit "s2", which is subtracted from the LSB2 input at sub-LSB DAC circuit 1104 to generate digital output "D3". The digital output "D3" drives sub-LSB DAC circuit 1110.

The modulation bit "s2" is added along with the LSB1 to the delta-sigma modulator 304 of cluster2 to generate the modulation bit "s1".

Figure 16:
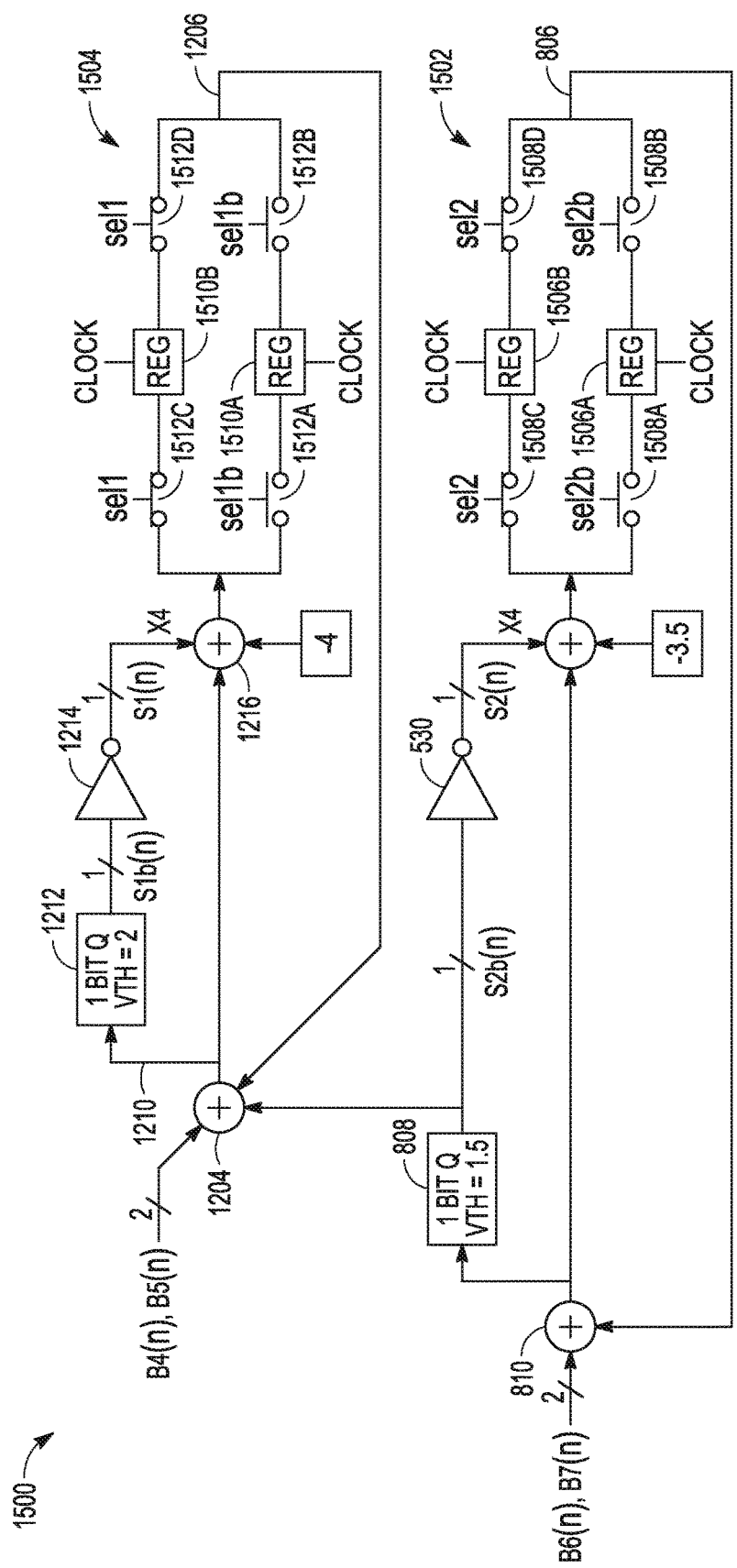
FIG. 16 depicts the delta-sigma modulator configuration of FIG. 14 including a dual register technique, in accordance with this disclosure.

FIG. 16 depicts the delta-sigma modulator configuration of FIG. 14 including a dual register technique, in accordance with this disclosure. As seen in FIG. 16, the each of the registers 804, 1208 of FIG. 14 has been replaced by a respective dual register circuit 1502, 1504. The dual register circuit 1502 includes two registers 1506A, 1506B where register 1506A can be selected by a clock signal and a control signal "sel2*b*" to close switches 1508A, 1508B, and switches 1508C and 1508D can be opened by complementary control signal "sel2". The register 1506B can be selected by a clock signal and a control signal "sel2" to close switches 1508C, 1508D, and switches 1508C and 1508D can be opened by complementary control signal "sel2*b*". The dual register circuit 1504 includes two registers 1510A, 1510B and can be similarly selected using switches 1512A-1512D.

The dual register circuits 1502, 1504 shown in FIG. 16 can reduce or eliminate idle tones, without the addition of dither. Dither can require additional headroom, which may be unavailable in some implementations.

The control signals can randomly select which register to use, which can reduce or eliminate idle tones. In some example implementations, it can be desirable to add dither to the delta-sigma modulator, as shown in FIG. 17.

Figure 17:
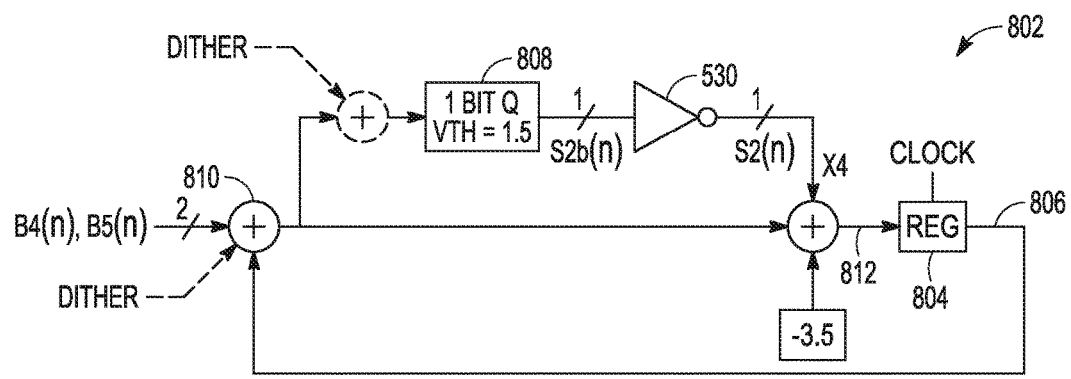
FIG. 17 depicts the delta-sigma modulator configuration of FIG. 14 including the addition of dither, in accordance with this disclosure.

FIG. 17 depicts the delta-sigma modulator circuit 802 of FIG. 10B including the addition of dither, in accordance with this disclosure. Dither can be added to the delta-sigma modulator circuit 802 to help randomization. As seen in FIG. 17, dither can be added at various locations in the circuit. In some examples, dither can be added to the input to the quantizer 808. In other examples, dither can be added with the data input, e.g., B4(*n*), B5(*n*), by adder 810 and then fed to the register circuit 804.

Figure 18:
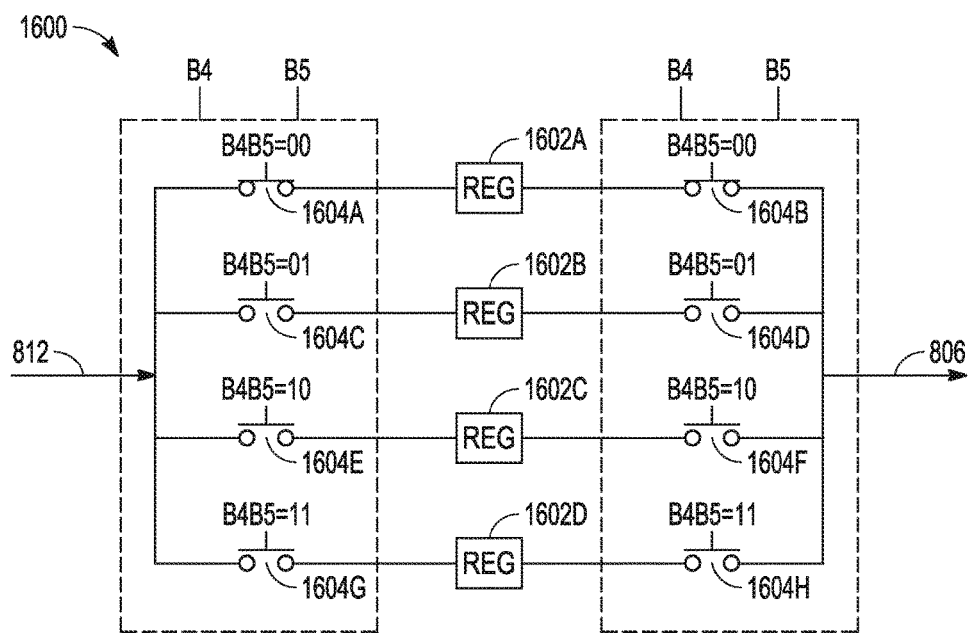
FIG. 18 depicts an example of a code-selected register circuit to reduce tone generation, in accordance with this disclosure.

FIG. 18 depicts an example of a code-selected register circuit to reduce tone generation, in accordance with this disclosure. The register circuit 1600 can be used in place of the register 804 in FIG. 10B and the registers 804, 1202 in FIG. 14, for example. To reduce tone generation, the data itself, e.g., B4, B5, can be the control signal to close/open the switches associated with the various registers in order to select one register.

The example circuit in FIG. 18 includes 4 registers 1602A-1602D and 8 switches 1604A-1604H. Each register can be selected by controlling two associated switches to close and opening the remaining six switches. For example, as seen in FIG. 18, a combination of B4,B5 equal to "11" would close switches 1604G, 1604H to select register 1602D, and open switches 1604A-1604F to deselect registers 1602A-1602C.

The various techniques described above can be used to linearize a DAC circuit. These techniques can be used for any type of DAC circuit, including, but not limited to, capacitor DACs, resistor DACs, current DACs. In addition, the DAC techniques of this disclosure can be used with any type of analog to digital converter, including but not limited to SAR ADCs, pipeline ADCs, and delta-sigma ADCs.

Figure 19:
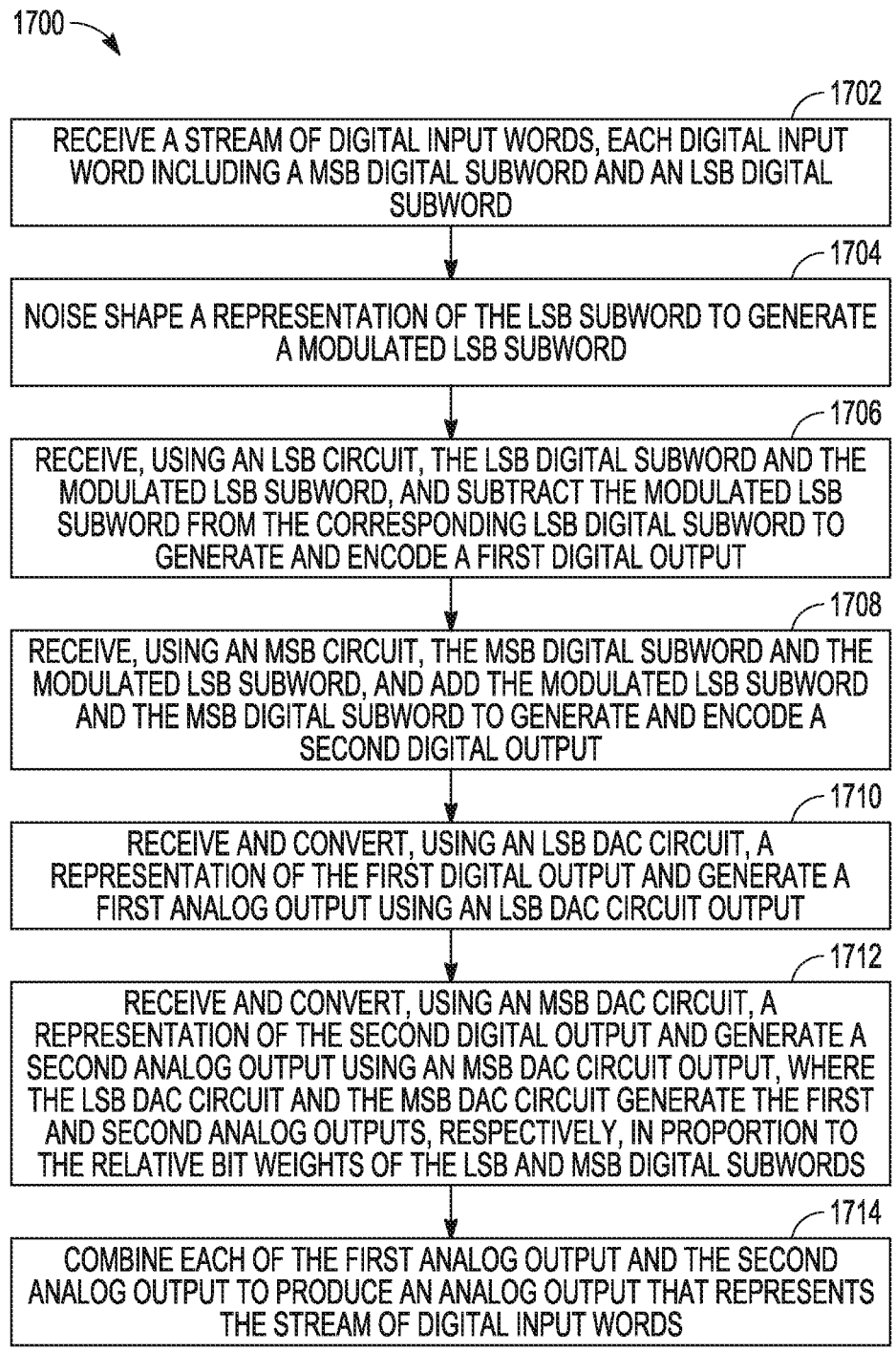
FIG. 19 is a flow diagram depicting an example of a method of operating a digital-to-analog converter circuit in an integrated circuit device to reduce gain mismatch errors.

FIG. 19 is a flow diagram depicting an example of a method 1700 of operating a digital-to-analog converter circuit in an integrated circuit device to reduce gain mismatch errors. At block 1702, the method 1700 can include receiving a stream of digital input words, each digital input word including a MSB digital subword and an LSB digital subword.

At block 1704, the method 1700 can include noise shaping a representation of the LSB subword to generate a modulated LSB subword, where the modulated LSB subword has a smaller word length than the LSB subword.

At block 1706, the method 1700 can include receiving, using an LSB circuit, the LSB digital subword and the modulated LSB subword, and subtracting the modulated LSB subword from the corresponding LSB digital subword to generate and encode a first digital output.

At block 1708, the method 1700 can include receiving, using an MSB circuit, the MSB digital subword and the modulated LSB subword, and adding the modulated LSB subword and the MSB digital subword to generate and encode a second digital output.

At block 1710, the method 1700 can include receiving and converting, using an LSB DAC circuit, a representation of the first digital output and generating a first analog output using an LSB DAC circuit output.

At block 1712, the method 1700 can include receiving and converting, using an MSB DAC circuit, a representation of the second digital output and generating a second analog output using an MSB DAC circuit output, wherein the LSB DAC circuit and the MSB DAC circuit generate the first and second analog outputs, respectively, in proportion to the relative bit weights of the LSB and MSB digital subwords.

At block 1714, the method 1700 can include combining each of the first analog output and the second analog output to produce an analog output that represents the stream of digital input words.

Various Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A digital-to-analog converter (DAC) circuit to reduce gain mismatch errors and including an input to receive a stream of digital input words, each digital input word partitioned into a most significant bit (MSB) digital subword and a least significant bit (LSB) digital subword, the circuit comprising:
   a digital noise shaper circuit to receive a representation of the LSB subword, the digital noise shaper configured to output a modulated LSB subword;
   an LSB DAC circuit to receive and convert a combination of a representation of the LSB subword and the modulated LSB subword and to generate a first analog output;
   an MSB DAC circuit to receive and convert a combination of a representation of the MSB digital subword and the modulated LSB subword and to generate a second analog output,
   wherein each of the first analog output and the second analog output are combined to produce an analog output that represents the stream of digital input words.

2. The DAC circuit of claim 1, the circuit comprising:
   a segmentation circuit including an input to receive the stream of digital input words, the segmentation circuit comprising:
      the digital noise shaper circuit;
      an LSB circuit to receive the LSB digital subword and the modulated LSB subword, the LSB circuit to combine the modulated LSB subword and the corresponding LSB digital subword to generate a first digital output;
      an MSB circuit to receive the MSB digital subword and the modulated LSB subword, the MSB circuit to combine the modulated LSB subword and the MSB digital subword to generate a second digital output.

3. The DAC circuit of claim 1, wherein the digital noise shaper circuit includes a delta-sigma modulator circuit.

4. The DAC circuit of claim 3, wherein the digital noise shaper circuit includes a delaying integrator circuit, and wherein the modulated LSB subword received by the LSB circuit is a complement of the modulated LSB subword received by the MSB circuit.

5. The DAC circuit of claim 2, wherein the digital noise shaper circuit is coupled to an output of the LSB circuit.

6. The DAC circuit of claim 2, wherein the digital noise shaper circuit is coupled to an input of the LSB circuit.

7. The DAC circuit of claim 6, further comprising:
   an MSB delay circuit coupled to an input of the MSB circuit to receive and delay the MSB digital subword; and
   an LSB delay circuit coupled to an input of the LSB circuit to receive and delay the LSB digital subword.

8. The DAC circuit of claim 2, wherein the digital noise shaper circuit includes a delta-sigma modulator circuit having an error feedback configuration, and wherein the delta-sigma modulator circuit is coupled to an input of the LSB circuit.

9. The DAC circuit of claim 2, wherein the stream of digital input words further includes a sub-LSB digital subword, the segmentation circuit further comprising:
- a sub-LSB digital noise shaper circuit having an input to receive a representation of the sub-LSB subword, the sub-LSB digital noise shaper configured to output a modulated sub-LSB subword;
- a sub-LSB circuit to receive the sub-LSB digital subword and the modulated sub-LSB subword, the sub-LSB circuit to subtract the modulated sub-LSB subword from the corresponding sub-LSB digital subword to generate a third digital output; and
- a sub-LSB DAC circuit to receive and convert a representation of the third digital output and to generate a third analog output.

10. The DAC circuit of claim 1, wherein the digital noise shaper circuit includes a dual register circuit having a first register and a second register, wherein the first register and the second register are randomly selected.

11. The DAC circuit of claim 1, wherein the digital noise shaper circuit includes a plurality of code-selected registers.

12. The DAC circuit of claim 1, further comprising:
- a dither generator circuit configured to provide different dither values to the digital noise shaper circuit.

13. A method of operating a digital-to-analog converter circuit to reduce gain mismatch errors, the method comprising:
- receiving a stream of digital input words, each digital input word partitioned into a most significant bit (MSB) digital subword and a least significant bit (LSB) digital subword;
- noise shaping a representation of the LSB subword to generate a modulated LSB subword;
- receiving and converting a combination of a representation of the LSB subword and the modulated LSB subword and generating a first analog output;
- receiving and converting a combination of a representation of the MSB digital subword and the modulated LSB subword and generating a second analog output; and
- combining each of the first analog output and the second analog output to produce an analog output that represents the stream of digital input words.

14. The method of claim 13, the method further comprising:
- receiving, using an LSB circuit, the LSB digital subword and the modulated LSB subword, and combining the modulated LSB subword and the corresponding LSB digital subword to generate a first digital output;
- receiving, using an MSB circuit, the MSB digital subword and the modulated LSB subword, and combining the modulated LSB subword and the MSB digital subword to generate a second digital output.

15. The method of claim 13, wherein noise shaping a representation of the LSB subword to generate a modulated LSB subword includes using a delta-sigma modulator circuit to noise shape the representation of the LSB subword to generate the modulated LSB subword.

16. The method of claim 13, wherein the noise shaping includes using a delaying integrator circuit.

17. The method of claim 14, further comprising:
coupling a noise shaping circuit to an output of the LSB circuit.

18. The method of claim 14, further comprising:
coupling a noise shaping circuit to an input of the LSB circuit.

19. The method of claim 18, further comprising:
- coupling an MSB delay circuit to an input of the MSB circuit to receive and delay the MSB digital subword; and
- coupling an LSB delay circuit to an input of the LSB circuit to receive and delay the LSB digital subword.

20. The method of claim 14, wherein noise shaping a representation of the LSB subword to generate a modulated LSB subword includes using a delta-sigma modulator circuit having an error feedback configuration to noise shape the representation of the LSB subword to generate the modulated LSB subword, the method further comprising:
coupling the delta-sigma modulator circuit to an input of the LSB circuit.

21. An integrated circuit device comprising:
- an analog-to-digital converter circuit including a digital-to-analog converter (DAC) circuit, the DAC circuit comprising:
  - a segmentation circuit including an input to receive a stream of digital input words, each digital input word including a MSB digital subword and an LSB digital subword, the segmentation circuit comprising:
    - a digital noise shaper circuit having an input to receive a representation of the LSB subword, the digital noise shaper configured to output a modulated LSB subword, wherein the modulated LSB subword has a smaller word length than the LSB subword;
    - an LSB circuit to receive the LSB digital subword and the modulated LSB subword, the LSB circuit to subtract the modulated LSB subword from the corresponding LSB digital subword to generate a first digital output, the LSB circuit including an LSB encoder circuit;
    - an MSB circuit to receive the MSB digital subword and the modulated LSB subword, the MSB circuit to add the modulated LSB subword and the MSB digital subword to generate a second digital output, the MSB circuit including an MSB encoder circuit;
  - an LSB DAC circuit to receive and convert a representation of the first digital output and to generate a first analog output using an LSB DAC circuit output;
  - an MSB DAC circuit to receive and convert a representation of the second digital output and to generate a second analog output using an MSB DAC circuit output, wherein the LSB DAC circuit and the MSB DAC circuit generate the first and second analog outputs, respectively, in proportion to the relative bit weights of the LSB and MSB digital subwords,
  - wherein the LSB DAC circuit output is coupled to the MSB DAC circuit output to combine each of the first analog output and the second analog output to produce an analog output that represents the stream of digital input words.

* * * * *